(12) United States Patent
Lu

(10) Patent No.: US 10,082,713 B2
(45) Date of Patent: Sep. 25, 2018

(54) THIN FILM TRANSISTOR AND LIQUID CRYSTAL DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Ting Hao Lu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/778,117

(22) PCT Filed: Apr. 3, 2015

(86) PCT No.: PCT/CN2015/075879
§ 371 (c)(1),
(2) Date: Nov. 21, 2016

(87) PCT Pub. No.: WO2016/145695
PCT Pub. Date: Sep. 22, 2016

(65) Prior Publication Data
US 2017/0102595 A1  Apr. 13, 2017

(30) Foreign Application Priority Data

Mar. 17, 2015 (CN) .......................... 2015 1 0116545

(51) Int. Cl.
*G02F 1/1362* (2006.01)
*G02F 1/1368* (2006.01)
(Continued)

(52) U.S. Cl.
CPC ...... *G02F 1/136209* (2013.01); *G02F 1/1368* (2013.01); *H01L 27/1218* (2013.01);
(Continued)

(58) Field of Classification Search
None
See application file for complete search history.

(56) References Cited

U.S. PATENT DOCUMENTS 5,760,861 A * 6/1998 Kim .................. G02F 1/136209
349/110
6,304,309 B1 * 10/2001 Yamanaka ........ G02F 1/133377
349/153
(Continued)

FOREIGN PATENT DOCUMENTS

CN  101393344  3/2009
CN  101750785  6/2010
(Continued)

*Primary Examiner* — Michelle Mandala
(74) *Attorney, Agent, or Firm* — Kim Winston LLP

(57) ABSTRACT

Related to is a thin film transistor and a liquid crystal display device. The thin film transistor comprises a substrate, and a conductive laminate and a light-shielding layer that are both arranged on the substrate, wherein the light-shielding layer is located below and directly opposite to the conductive laminate. The thin film transistor is provided therein with the light-shielding layer for shading light from irradiating the conductive laminate, thereby effectively preventing unfavorable influences imposed on the electrical properties of oxides by illumination, and thus improving the electrical properties of the thin film transistor.

10 Claims, 2 Drawing Sheets

(51) Int. Cl.
*H01L 29/786* (2006.01)
*H01L 27/12* (2006.01)

(52) U.S. Cl.
CPC ...... *H01L 27/1225* (2013.01); *H01L 29/7869* (2013.01); *H01L 29/78633* (2013.01)

(56) References Cited

U.S. PATENT DOCUMENTS

| | | |
|---|---|---|
| 2003/0207049 A1 | 11/2003 | Sekine et al. |
| 2004/0081498 A1* | 4/2004 | Tu ............................ B41J 2/465 400/118.2 |
| 2008/0225193 A1* | 9/2008 | Katayama ........... G02F 1/13452 349/40 |
| 2010/0210070 A1* | 8/2010 | Wakana ............ H01L 21/02554 438/104 |
| 2016/0085096 A1* | 3/2016 | Moriwaki ............. G02F 1/1337 349/43 |

FOREIGN PATENT DOCUMENTS

| | | |
|---|---|---|
| CN | 102832255 | 12/2012 |
| CN | 103474573 | 12/2013 |
| CN | 103579356 | 2/2014 |
| CN | 103762244 | 4/2014 |
| JP | 2003229573 | 8/2003 |

* cited by examiner

THIN FILM TRANSISTOR AND LIQUID CRYSTAL DISPLAY DEVICE

CROSS-REFERENCE TO RELATED APPLICATIONS

The present application claims benefit of Chinese patent application CN 201510116545.3, entitled "Thin film transistor and liquid crystal display device" and filed on Mar. 17, 2015, the entirety of which is incorporated herein by reference.

FIELD OF THE INVENTION

The present disclosure relates to the field of liquid crystal display, and in particular, to a thin film transistor. The present disclosure further relates to a liquid crystal display device comprising the thin film transistor.

BACKGROUND OF THE INVENTION

Thin film transistors (commonly known as TFTs by those skilled in the art) are at present widely used in liquid crystal display devices, for driving all liquid crystal display pixels located on the liquid crystal display devices. As a result, the electrical properties of the thin film transistors are of significant importance to the quality of the liquid crystal display devices.

A thin film transistor is typically formed by a stack of multiple layers of oxides (i.e., a conductive laminate). The electrical properties of these oxides, however, are not sufficiently stable, and rather vulnerable to external factors, especially illumination. For example, illumination would affect the electrical properties of these oxides, and thereby increase leak currents, which will bring unfavorable influences on the electrical properties of the thin film transistor.

As can be concluded, it is necessary to ameliorate such thin film transistors.

SUMMARY OF THE INVENTION

Directed against the above problem, the present disclosure provides a thin film transistor. The thin film transistor of the present disclosure is provided therein with a light-shielding layer, which can shade light from irradiating a conductive laminate, thereby effectively preventing unfavorable influences imposed on the electrical properties of oxides by illumination. This can improve electrical properties of the thin film transistor.

According to a first aspect of the present disclosure, a thin film transistor is provided, comprising a substrate, and a conductive laminate and a light-shielding layer that are both arranged on the substrate, wherein the light-shielding layer is located below and directly opposite to the conductive laminate.

According to the thin film transistor of the present disclosure, due to arrangement of the light-shielding layer, light from below the substrate cannot irradiate the conductive laminate. Thus, the electrical properties of the conductive laminate will not be deteriorated due to illumination, which ensures superior performance of the thin film transistor. Particularly, when the thin film transistor of the present disclosure is used in a liquid crystal display device, superior electrical properties of the thin film transistor will also guarantee excellent display quality of the liquid crystal display device.

In one embodiment, the dimension of the light-shielding layer is larger than or equal to that of the conductive laminate. This can prevent scattered light from bypassing the light-shielding layer to irradiate the conductive laminate, thereby leaving the electrical properties of the conductive laminate free from any influences.

In one embodiment, the conductive laminate is arranged on a first surface of the substrate, while the light-shielding layer is arranged on a second surface of the substrate, the first surface and the second surface being opposite to each other. According to such a structure, the conductive laminate and the light-shielding layer are located on different side surfaces of the substrate. Thus, the conductive laminate will be a completely planar structure, without any climbing regions caused by a projecting region of the conductive laminate. Hence, the electrical properties of the conductive laminate will be free from any unfavorable influences imposed by a climbing region, which facilitates further improvement of the electrical properties of the thin film transistor.

In one embodiment, the second surface of the substrate is provided with a photosensitive material, and a portion of the photosensitive material corresponding to the conductive laminate is exposed to become opaque, so as to form the light-shielding layer. This can facilitate accurate control of position and area of the light-shielding layer, and prevent formation of an additional light-shielding layer in a region apart from the region to be formed into the light-shielding layer, thereby benefiting implementation of the light-shielding layer in the liquid crystal display device.

In one embodiment, an opaque layer is provided on the second surface of the substrate in a region directly facing the conductive laminate, so as to form the light-shielding layer. In one embodiment, the opaque layer is a metal layer or a nonmetallic oxide layer. Preferably, the opaque layer is made of one selected from a group consisting of aluminum, molybdenum, aluminum neodymium alloy, and silicon dioxide. Such a light-shielding layer can be firmly attached to the substrate, and is favorable for being used in the liquid crystal display device.

In one embodiment, the conductive laminate is arranged on the first surface of the substrate, and the light-shielding layer is arranged in an inner portion of the substrate. Thus, the light-shielding layer will be completely free from damages caused by external environment, and no climbing region will be formed in the conductive laminate. As a result, it can be ensured that, in any cases, the thin film transistor will be free from negative influences of external illumination, and the conductive laminate will be maintained in a completely planar structure also.

In one preferred embodiment, the inner portion of the substrate is provided with a photosensitive material, and a portion of the photosensitive material corresponding to the conductive laminate is exposed to become opaque, so as to form the light-shielding layer. This can also facilitate accurate control of position and area of the light-shielding layer, and prevent formation of an additional light-shielding layer in a region apart from the region to be formed into the light-shielding layer, thereby benefiting implementation of the light-shielding layer in the liquid crystal display device. In addition, for such a light-shielding layer, it is unnecessary to fixedly arrange or form any additional opaque layers or opaque substances on an outer surface of the substrate. Instead, merely selective exposure is required, thereby significantly simplifying manufacture procedures of the thin film transistor or the light-shielding layer, and thus cutting down costs.

According to a second aspect of the present disclosure, a liquid crystal display device is provided, comprising the thin film transistor as described above according to the first aspect of the present disclosure.

Compared with the prior art, the present disclosure has the following advantages. On the one hand, since the thin film transistor of the present disclosure is provided therein with the light-shielding layer, light from below the substrate cannot irradiate the conductive laminate. Thus, the electrical properties of the conductive laminate will not be deteriorated due to illumination, thereby ensuring superior performance of the thin film transistor. The thin film transistor of the present disclosure is particularly useful in the liquid crystal display device. On the other hand, the conductive laminate and the light-shielding layer are located on different side surfaces of the substrate. Thus, the conductive laminate will be free from a climbing region caused by a projecting region of the conductive laminate. Hence, the electrical properties of the conductive laminate will be free from any unfavorable influences from a climbing region, which facilitates further improvement of the electrical properties of the thin film transistor.

BRIEF DESCRIPTION OF THE DRAWINGS

In the following, the present disclosure will be illustrated in detail in connection with embodiments and accompanying drawings, in which.

Figure 1:
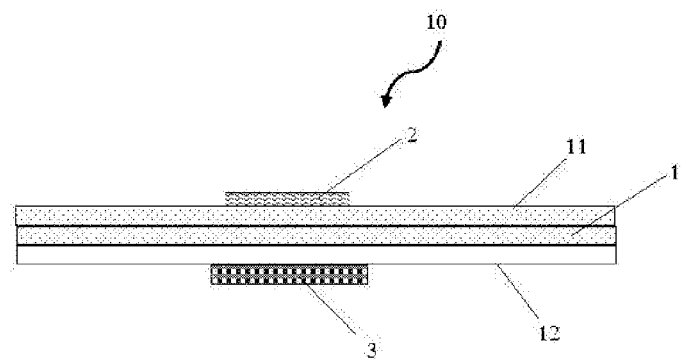
FIG. 1 schematically shows a first embodiment of a thin film transistor according to the present disclosure.

In the drawings, the same components are indicated with the same reference signs. The figures are not drawn in accordance with an actual scale.

DETAILED DESCRIPTION OF THE EMBODIMENTS

The present disclosure will be further explained in conjunction with the accompanying drawings.

FIG. 1 schematically shows a first embodiment of a thin film transistor 10 according to the present disclosure. As illustrated in FIG. 1, the thin film transistor 10 comprises a substrate 1, and a conductive laminate 2 and a light-shielding layer 3 that are both arranged on the substrate 1. The substrate 1 can be a transparent glass substrate. And the conductive laminate 2 typically can include a source, a drain, an oxide active layer, a gate insulator, and a gate. This is well known by those skilled in the art, and will therefore not be repeated.

The light-shielding layer 3 is located below and directly opposite to the conductive laminate 2. Such being the case, light from below the substrate 1 will not irradiate the conductive laminate 2, the electrical properties of which will thus not be deteriorated due to such irradiation. The electrical properties of the thin film transistor 10 will also be maintained well thereby. This is rather favorable for a liquid crystal display device (not shown) using the thin film transistor 10. Preferably, the dimension of the light-shielding layer 3 is larger than or equal to that of the conductive laminate 2, so as to prevent scattered light from bypassing the light-shielding layer 3 to irradiate the conductive laminate 2.

In order to enable the conductive laminate 2 to have a completely planar structure, the conductive laminate 2 and the light-shielding layer 3 are arranged on different side surfaces of the substrate 1, respectively. As shown in FIG. 1, the conductive laminate 2 is arranged on a first surface 11 of the substrate 1, while the light-shielding layer 3 is arranged on a second surface 12 of the substrate 1, wherein the first surface 11 and the second surface 12 are opposite to each other. As such, the conductive laminate 2 will have a completely planar structure, particularly without any projecting portions. The grain size and morphology of the material of the conductive laminate 2 and the thickness of the conductive laminate 2 are substantially homogeneous. As a result, on the whole, the electrical properties of the conductive laminate 2 are all same in different regions, thereby rendering the electrical properties of the thin film transistor 10 superior also.

Figure 3:
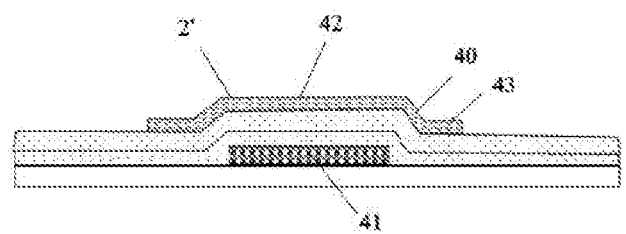
FIG. 3 schematically shows the structure of a thin film transistor having a climbing region.
Figure 4:
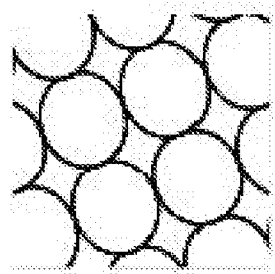
FIGS. 4 and 5 schematically show features of materials in different regions as indicated in FIG. 3, respectively.
Figure 5:
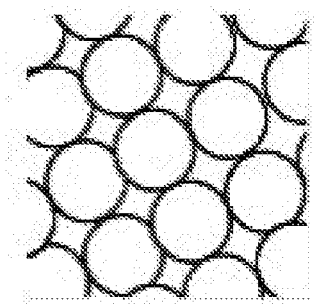

Contrary to the embodiment as shown in FIG. 1, a conductive laminate 2' as depicted in FIG. 3 has a climbing region 40, which is formed due to an additional layer 41 disposed between the conductive laminate 2' and a substrate 1'. The additional layer 41 can be a light-shielding layer. Because the additional layer 41 has a certain thickness, a region 42 of the conductive laminate 2' located above the additional layer 41 is lifted, i.e., the conductive laminate 2' has a projecting region 42 and an original region 43. And the climbing region 40 is formed between the original region 43 and the projecting region 42. The projecting region 42 or the original region 43 has a grain size therein (as shown in FIG. 4) much larger than the grain size in the climbing region 40 (as shown in FIG. 5). Therefore, the electrical properties of the conductive laminate 2' will be different in different regions thereof due to different characteristics of materials. This will impose unfavorable influences on the electrical properties of the thin film transistor.

The light-shielding layer 3 as shown in FIG. 1 can be achieved as follows. A photosensitive material layer can be provided on the second surface 12 of the substrate 1. A portion of the photosensitive material corresponding to the conductive laminate 2 can be exposed and become opaque, so as to form the light-shielding layer 3. In one embodiment, the photosensitive material can be a silver halide, such as silver iodide, and can also be a dichromate, such as ammonium dichromate. Other similar photosensitive materials can be used also, and will not be repeated herein. A mask plate can be used to selectively expose the photosensitive material, and form the light-shielding layer 3, which is rather favorable for controlling position and area of the light-shielding layer 3.

The light-shielding layer 3 as shown in FIG. 1 can be achieved through the following approach also. An opaque layer can be arranged on the second surface 12 of the substrate 1 in a region thereof directly facing the conductive laminate 2, so as to form the light-shielding layer 3. The opaque layer can, for example, be a metal layer or a nonmetallic oxide layer. Preferably, the metal layer can be aluminum, molybdenum, or aluminum neodymium alloy. And the nonmetallic oxide layer can be silicon dioxide. In addition, such an opaque layer can have a thickness in the range from 5 to 8 µm. It can be formed through a procedure such as evaporation coating and magnetron sputtering, and firmly attached to the substrate 1.

Figure 2:
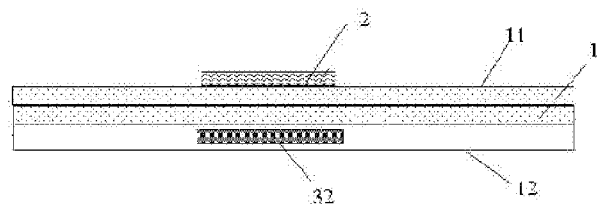
FIG. 2 schematically shows a second embodiment of the thin film transistor according to the present disclosure.

FIG. 2 schematically shows a light-shielding layer 32 according to a second embodiment. The light-shielding layer 32 is herein formed in an inner portion of the substrate 1 in a position opposite to the conductive laminate 2. Since the light-shielding layer 32 is located within the substrate 1, it will be completely free from influences or damages by external factors, thereby ensuring that the conductive laminate 2 will not be influenced by irradiation.

In one embodiment, the inner portion of the substrate 1 can be provided with a photosensitive material, a portion of which corresponding to the conductive laminate 2 can be exposed and become opaque, so as to form the light-shielding layer 32. The photosensitive material can be a silver halide, such as silver iodide, and can also be a dichromate, such as ammonium dichromate. Other similar photosensitive materials can be used also, and will not be repeated herein. In practice, the photosensitive material can be added while the substrate 1 is being prepared. And when the substrate 1 is used to manufacture the thin film transistor, a mask plate (not shown) can be turned to, for selective exposure of the photosensitive material, so as to form the light-shielding layer 32. No opaque layers or opaque substances will be necessary to be arranged on an outer surface of the substrate 1, thereby significantly simplifying manufacturing procedures of the thin film transistor or the liquid crystal display device, and cutting down costs thereof.

Although the present disclosure has been described with reference to preferred embodiments, various modifications and variants to the present disclosure may be made by anyone skilled in the art, without departing from the scope of the present disclosure. In particular, as long as there is no structural conflict, various embodiments as well as the respective technical features mentioned herein may be combined with one another in any manner. The present disclosure is not limited to the specific embodiments disclosed herein, but rather includes all the technical solutions falling within the scope of the claims.

The invention claimed is:

1. A thin film transistor, comprising:
 a substrate, and a conductive laminate and a light-shielding layer that are both arranged on the substrate,
 wherein the light-shielding layer is located below and directly opposite to the conductive laminate,
 wherein the conductive laminate is arranged on a first surface of the substrate, and the light-shielding layer is arranged on a second surface of the substrate, the first surface and the second surface being opposite to each other, and
 wherein the second surface of the substrate is provided with a photosensitive material, and a portion of the photosensitive material which is corresponding to the conductive laminate is exposed to become opaque, so as to form the light-shielding layer.

2. The thin film transistor according to claim 1, wherein an opaque layer is provided on the second surface of the substrate in a region directly facing the conductive laminate, so as to form the light-shielding layer.

3. The thin film transistor according to claim 2, wherein the opaque layer is a metal layer or a nonmetallic oxide layer.

4. The thin film transistor according to claim 3, wherein the opaque layer is made of one selected from a group consisting of aluminum, molybdenum, aluminum neodymium alloy, and silicon dioxide.

5. The thin film transistor according to claim 1, wherein the conductive laminate is arranged on a first surface of the substrate, while the light-shielding layer is arranged in an inner portion of the substrate.

6. The thin film transistor according to claim 5, wherein the inner portion of the substrate is provided with a photosensitive material, and a portion of the photosensitive material which is corresponding to the conductive laminate is exposed to become opaque, so as to form the light-shielding layer.

7. The thin film transistor according to claim 1, wherein a dimension of the light-shielding layer is larger than or equal to that of the conductive laminate.

8. The thin film transistor according to claim 1, wherein a dimension of the light-shielding layer is larger than or equal to that of the conductive laminate.

9. The thin film transistor according to claim 5, wherein a dimension of the light-shielding layer is larger than or equal to that of the conductive laminate.

10. A liquid crystal display device, comprising:
 a thin film transistor which includes:
  a substrate, and a conductive laminate and a light-shielding layer that are both arranged on the substrate,
 wherein the light-shielding layer is located below and directly opposite to the conductive laminate,
 wherein the conductive laminate is arranged on a first surface of the substrate, and the light-shielding layer is arranged on a second surface of the substrate, the first surface and the second surface being opposite to each other, and
 wherein the second surface of the substrate is provided with a photosensitive material, and a portion of the photosensitive material which is corresponding to the conductive laminate is exposed to become opaque, so as to form the light-shielding layer.

* * * * *